United States Patent
Nishihara et al.

(10) Patent No.: US 9,071,224 B2
(45) Date of Patent: Jun. 30, 2015

(54) FILTER AND DUPLEXER

(71) Applicant: TAIYO YUDEN CO., LTD., Tokyo (JP)

(72) Inventors: Tokihiro Nishihara, Tokyo (JP); Shinji Taniguchi, Tokyo (JP); Toshio Nishizawa, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 308 days.

(21) Appl. No.: 13/666,524

(22) Filed: Nov. 1, 2012

(65) Prior Publication Data

US 2013/0147577 A1    Jun. 13, 2013

(30) Foreign Application Priority Data

Dec. 12, 2011 (JP) .................. 2011-271469

(51) Int. Cl.
*H03H 9/54* (2006.01)
*H03H 9/56* (2006.01)
*H03H 9/13* (2006.01)
*H03H 9/17* (2006.01)
*H03H 9/60* (2006.01)
*H03H 9/70* (2006.01)
*H03H 3/04* (2006.01)

(52) U.S. Cl.
CPC .............. *H03H 9/132* (2013.01); *H03H 9/54* (2013.01); *H03H 9/173* (2013.01); *H03H 9/174* (2013.01); *H03H 9/175* (2013.01); *H03H 9/605* (2013.01); *H03H 9/706* (2013.01); *H03H 2003/0471* (2013.01)

(58) Field of Classification Search
CPC ....... H03H 9/46; H03H 9/54; H03H 9/02007; H03H 9/02086; H03H 9/02118; H03H 9/132

USPC .......................................... 333/187–192, 133
See application file for complete search history.

(56) References Cited

U.S. PATENT DOCUMENTS

| | | | | |
|---|---|---|---|---|
| 7,423,501 | B2 * | 9/2008 | Kim et al. ...................... | 333/187 |
| 7,586,389 | B2 * | 9/2009 | Ali-Ahmad et al. ........... | 333/133 |
| 7,675,389 | B2 * | 3/2010 | Yamakawa et al. ............ | 333/133 |
| 7,952,257 | B2 * | 5/2011 | Iwaki et al. .................... | 310/320 |
| 8,125,123 | B2 * | 2/2012 | Nishihara et al. .............. | 310/365 |
| 8,878,419 | B2 * | 11/2014 | Miyake .......................... | 310/320 |

(Continued)

FOREIGN PATENT DOCUMENTS

| | | |
|---|---|---|
| JP | 2005-223808 A | 8/2005 |
| JP | 2006-109472 A | 4/2006 |

(Continued)

*Primary Examiner* — Dean Takaoka
*Assistant Examiner* — Alan Wong
(74) *Attorney, Agent, or Firm* — Chen Yoshimura LLP (57) ABSTRACT

A filter includes: a plurality of piezoelectric thin film resonators, each having a multilayered film including a lower electrode located on a substrate, a piezoelectric film located on the lower electrode, and an upper electrode located on the piezoelectric film so as to face the lower electrode, wherein at least two piezoelectric thin film resonators have thick film portions, in each of which the multilayered film is thicker in at least a part of an outer peripheral portion than in an inner portion of a resonance region in which the lower electrode and the upper electrode face each other across the piezoelectric film, and lengths of the thick film portions from edges of the resonance regions are different from each other in the at least two piezoelectric thin film resonators.

15 Claims, 11 Drawing Sheets

(56) References Cited

U.S. PATENT DOCUMENTS

| | | |
|---|---|---|
| 8,896,395 B2 * | 11/2014 | Burak et al. .................. 333/187 |
| 2006/0103492 A1 | 5/2006 | Feng et al. |
| 2008/0296529 A1 | 12/2008 | Akiyama et al. |
| 2010/0148636 A1 | 6/2010 | Nishihara et al. |
| 2011/0298564 A1 * | 12/2011 | Iwashita et al. ............... 333/187 |

FOREIGN PATENT DOCUMENTS

| | | |
|---|---|---|
| JP | 2009-10926 A | 1/2009 |
| WO | 2009/011148 A1 | 1/2009 |

\* cited by examiner

FILTER AND DUPLEXER

CROSS-REFERENCE TO RELATED APPLICATION

This application is based upon and claims the benefit of priority of the prior Japanese Patent Application No. 2011-271469, filed on Dec. 12, 2011, the entire contents of which are incorporated herein by reference.

FIELD

A certain aspect of the present invention relates to a filter and a duplexer.

BACKGROUND

Surface acoustic wave (SAW: Surface Acoustic Wave) filters and bulk acoustic wave (BAW: Bulk Acoustic Wave) filters are used as filters and duplexers for a high-frequency circuit used in wireless terminals such as mobile phone terminals. BAW filters have advantages of low-loss, steep skirt characteristic, high ESD (electro-static discharge) and high power durability as compared to SAW filters. The BAW filter is composed of a piezoelectric thin film resonator for example. Exemplary piezoelectric thin film resonators are a piezoelectric thin film resonator of an FBAR (Film Bulk Acoustic Resonator) type and a piezoelectric thin film resonator of an SMR (Solidly Mounted Resonator) type.

The piezoelectric thin film resonator of the FBAR type has a multilayered film formed by stacking a lower electrode, a piezoelectric film, and an upper electrode in this order on a substrate, and includes a space located below the lower electrode in a region (resonance region) in which the lower electrode and the upper electrode face each other across the piezoelectric film. On the other hand, the piezoelectric thin film resonator of the SMR type includes an acoustic reflection film formed by stacking a film having a high acoustic impedance and a film having a low acoustic impedance alternately with a film thickness of $\lambda/4$ ($\lambda$ is a wavelength of an acoustic wave) instead of the space.

There has been known ladder-type filters including resonators connected to a series arm and a parallel arm in a ladder shape as a filter. The ladder-type filter have advantages of low loss, high suppression and high power durability, and thus are used in SAW filters and BAW filters.

In recent years, a large number of frequency bands are used due to the rapid widespread of mobile phones. This demands a steep skirt characteristic of a filter. For example, the filter is desired to have the steep skirt characteristic in a duplexer with a narrow guard band which is a frequency band between a transmission band and a reception band.

For example, an effective electromechanical coupling coefficient $K^2_{eff}$ of a series resonator is made to be different from that of a parallel resonator in order to achieve the steep skirt characteristic at a high frequency side or low frequency side of a passband as disclosed in Japanese Patent Application Publication No. 2005-223808 (Patent Document 1). More specifically, the series resonator is a piezoelectric thin film resonator having the n-th harmonics as a principal vibration, and the parallel resonator is a piezoelectric thin film resonator having the m-th harmonics (m is equal to or more than (n+1)) as a principal vibration.

Japanese Patent Application Publication No. 2006-109472 discloses improving a Q-value of the piezoelectric thin film resonator by making thicker a thickness of a multilayered film in a resonance region in an outer peripheral portion. International Publication No. WO 2009/011148 discloses improving the Q-value of the piezoelectric thin film resonator and reducing a spurious by making thick the thickness of the multilayered film in an incline portion of a tip end of the lower electrode.

Patent Document 1 discloses using the piezoelectric thin film resonator having a fundamental wave as the principal vibration for the series resonator, and using the piezoelectric thin film resonator having the second harmonics as the principal vibration for the parallel resonator. The thickness of the multilayered film in the resonance region of the parallel resonator is made to be thicker than that of the series resonator in order to fabricate the above-described piezoelectric thin film resonator.

For example, it is desirable to control the $K^2_{eff}$ with respect to each of piezoelectric thin film resonators composing the filter in order to achieve the steep skirt characteristic of the filter. However, the method disclosed in Patent Document 1 complicates a fabrication process because the thickness of the multilayered film in the resonance region needs to be changed in each piezoelectric thin film resonator. Furthermore, the $K^2_{eff}$ is controlled by high-frequency vibration, and thus it is impossible to control the $K^2_{eff}$ continuously due to non-contiguous values of the $K^2_{eff}$.

SUMMARY OF THE INVENTION

According to an aspect of the present invention, there is provided a filter including: a plurality of piezoelectric thin film resonators, each having a multilayered film including a lower electrode located on a substrate, a piezoelectric film located on the lower electrode, and an upper electrode located on the piezoelectric film so as to face the lower electrode, wherein at least two piezoelectric thin film resonators have thick film portions, in each of which the multilayered film is thicker in at least a part of an outer peripheral portion than in an inner portion of a resonance region in which the lower electrode and the upper electrode face each other across the piezoelectric film, and lengths of the thick film portions from edges of the resonance regions are different from each other in the at least two piezoelectric thin film resonators.

According to another aspect of the present invention, there is provided a duplexer including: the above-described filter as at least one of a transmission filter and a reception filter.

According to another aspect of the present invention, there is provided a duplexer including: the above-described filter as at least one of a transmission filter and a reception filter, wherein at least one of the transmission filter and the reception filter is a ladder-type filter in which a series resonator and a parallel resonator included in the piezoelectric thin film resonators are connected in a ladder shape, the length of the thick film portion from the edge of the resonance region of one resonator, which is the series resonator or the parallel resonator so as to contribute to a skirt characteristic at a side of a guard band between a transmission band and a reception band, is longer than that of the other resonator.

DETAILED DESCRIPTION

A description will now be given of embodiments of the present invention with reference to the attached drawings.

First Embodiment

Figure 1A:
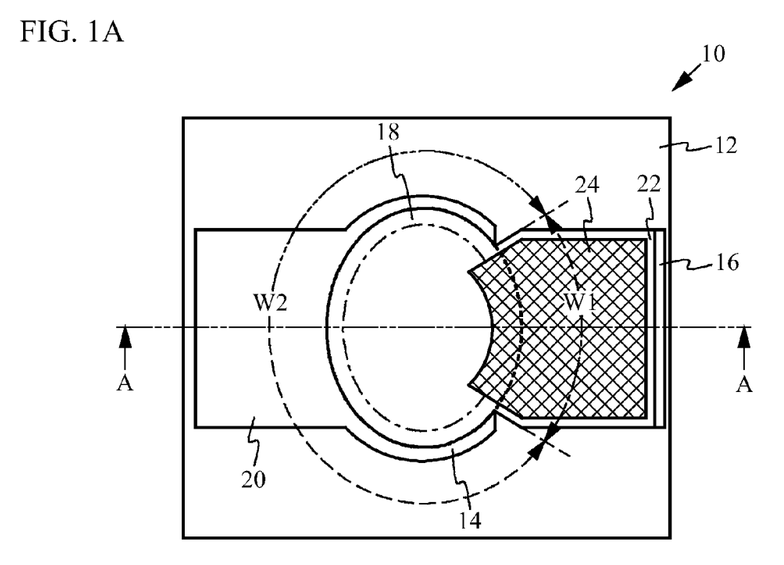
FIG. 1A is a top view of a piezoelectric thin film resonator.
Figure 1B:
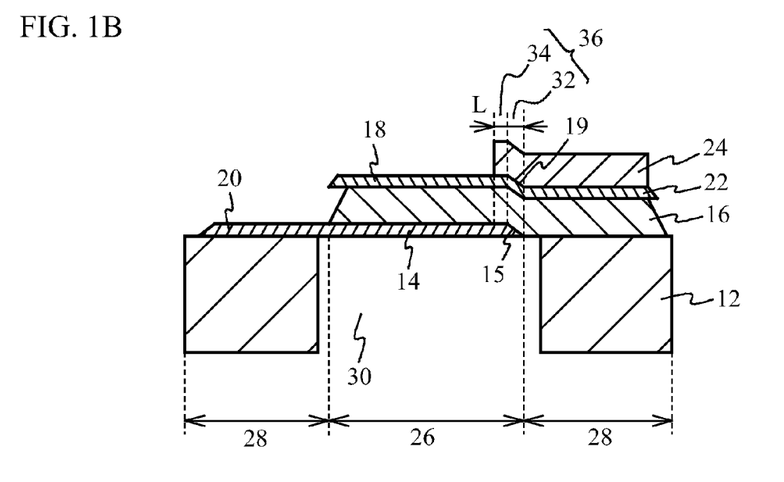
FIG. 1B is a cross-sectional view taken along line A-A in FIG. 1A.

A description will be given of a piezoelectric thin film resonator used in a filter in accordance with a first embodiment. FIG. 1A is a top view of the piezoelectric thin film resonator, and FIG. 1B is a cross-sectional view taken along line A-A in FIG. 1A. As illustrated in FIG. 1A and FIG. 1B, a piezoelectric thin film resonator 10 is of an FBAR type, and mainly includes a substrate 12, a lower electrode 14, a piezoelectric film 16, an upper electrode 18, a first terminal electrode 20, a second terminal electrode 22, and an additional film 24.

The substrate 12 is a silicon (Si) substrate or a glass substrate, for example. The lower electrode 14 and the first terminal electrode 20 are located on the substrate 12, and the first terminal electrode 20 is connected to the lower electrode 14. The first terminal electrode 20 provides external electrical connection. The lower electrode 14 has a shape of an ellipse, and the first terminal electrode 20 is connected to one of two parts made by dividing the ellipse by the major axis. A dashed line indicates a part of an outline of the lower electrode 14 in FIG. 1A. The piezoelectric film 16 is located on the lower electrode 14. The piezoelectric film 16 is located so as to extend from the lower electrode 14 to a side opposite to the first terminal electrode 20.

The upper electrode 18 and the second terminal electrode 22 are located on the piezoelectric film 16, and the second terminal electrode 22 is connected to the upper electrode 18. The second terminal electrode 22 provides external electrical connection. The upper electrode 18 has a shape of an ellipse, and the second terminal electrode 22 is connected to one of two parts made by dividing the ellipse by the major axis. The piezoelectric film 16 has almost the same shape as a combined shape of the upper electrode 18 and the second terminal electrode 22. The lower electrode 14 and the upper electrode 18 have a region in which they face each other across the piezoelectric film 16. Acoustic waves resonate in this region (hereinafter, referred to as a resonance region 26), but do not resonate in other regions (hereinafter, referred to as a non-resonance region 28). The resonance region 26 also has a shape of an ellipse because the region, in which the lower electrode 14 and the upper electrode 18 overlap across the piezoelectric film 16, has a shape of an ellipse. The resonance region 26 may have a shape other than the ellipse.

The substrate 12 includes a space 30 having an aperture including the resonance region 26. The space 30 can be formed by dry etching the substrate 12 from a rear surface of the substrate 12 with fluorine based gas, for example.

The lower electrode 14 and the first terminal electrode 20 can be formed simultaneously by evaporation and liftoff, for example. Thus, edge portions of the lower electrode 14 and the first terminal electrode 20 are inclined against an upper surface of the substrate 12. The upper electrode 18 and the second terminal electrode 22 can be also formed simultaneously by evaporation and liftoff, for example. Thus, edge portions of the upper electrode 18 and the second terminal electrode 22 are inclined against the upper surface of the substrate 12. The piezoelectric film 16 can be formed by forming a film and then wet etching the film for example. Therefore, an edge portion of the piezoelectric film 16 is inclined against the upper surface of the substrate 12. A chain line indicates a top edge of an incline portion of the piezoelectric film 16 in FIG. 1A.

The additional film 24 is located on the second terminal electrode 22. The additional film 24 extends from the second terminal electrode 22 to a flat portion of the upper electrode 18 so as to pass an incline portion 19 of the upper electrode 18 located above an incline portion 15 of the lower electrode 14. Here, a region 32 is a region in which the incline portion 15 of the lower electrode 14 overlaps with the upper electrode 18 and the additional film 24, and a region 34 is a region that is located further in than the region 32 in the resonance region 26 and in which the lower electrode 14 overlaps with the upper electrode 18 and the additional film 24. That is to say, a combined portion of the region 32 and the region 34 in the resonance region 26 has a multilayered film formed by stacking the lower electrode 14, the piezoelectric film 16, the upper electrode 18, and the additional film 24. The other portion of the resonance region 26 has a multilayered film formed by stacking the lower electrode 14, the piezoelectric film 16, and the upper electrode 18. An example of the other portion of the resonance region 26 is an inner portion of the resonance region 26 such as a center portion of the resonance region 26. As described above, the combined portion of the region 32 and the region 34 is a portion having the multilayered film thicker than that of the other portion in the resonance region 26, and is referred to as a thick film portion 36. That is to say, the thick film portion 36 is formed with the additional film 24 in a part of an outer peripheral portion of the resonance region 26, and thus the multilayered film of the thick film portion 36 is thicker than that of the inner portion. A length of the thick film portion 36 from an edge of the resonance region 26 is expressed by L.

Here, a description will be given of conducted experiments. Fabricated is a piezoelectric thin film resonator having a resonance frequency of approximately 2 GHz using the structure illustrated in FIG. 1A and FIG. 1B. The substrate 12 is an Si substrate, and the lower electrode 14 and the first terminal electrode 20 are formed of Ru with a film thickness of 330 nm in the fabricated piezoelectric thin film resonator. The piezoelectric film 16 is formed of AlN with a film thickness of 1050 nm, and the upper electrode 18 and the second terminal electrode 22 are formed by stacking Ru with a film thickness of 320 nm and chrome (Cr) with a film thickness of 20 nm in this order from the piezoelectric film 16 side. The additional film 24 is formed by stacking titanium (Ti) with a film thickness of 100 nm and gold (Au) with a film thickness of 500 nm in this order from the second terminal electrode 22 side. An oxide silicon film (not illustrated) with a film thickness of 50 nm is formed in a region other than the additional film 24. The resonance region 26, in which the lower electrode 14 and the upper electrode 18 face each other, has a shape of an ellipse having a major axis of 210 μm and a minor axis of 115 μm.

Figure 2:
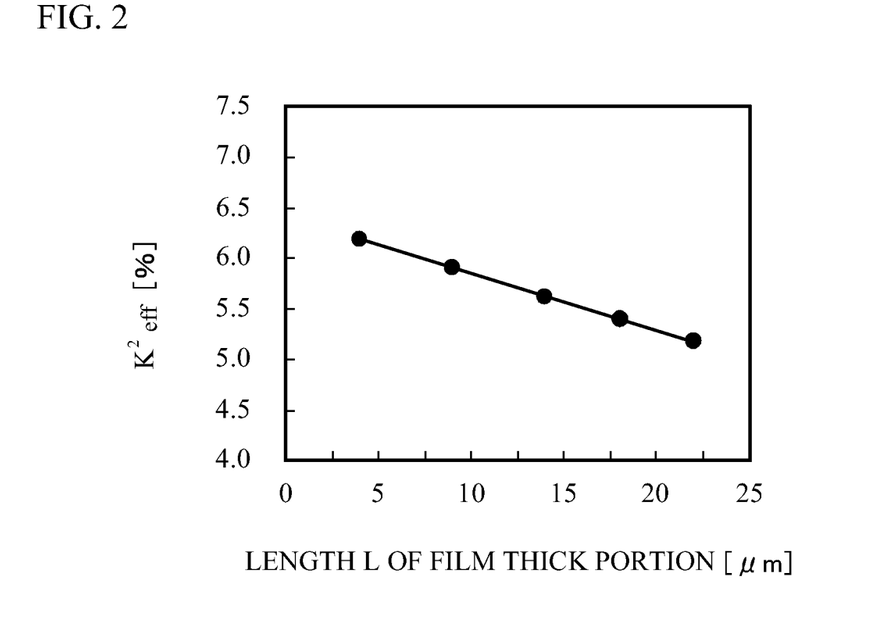
FIG. 2 is a diagram illustrating a relation between a length L of a thick film portion and an effective electromechanical coupling coefficient $K^2_{eff}$.

Multiple piezoelectric thin film resonators having the above-described structure are fabricated to have the length L of the thick film portion 36 different from each other, and examined is a relationship between the length L of the thick film portion 36 and an effective electromechanical coupling coefficient $K^2_{eff}$. FIG. 2 is measurements result of the relationship between the length L of the thick film portion 36 and the effective electromechanical coupling coefficient $K^2_{eff}$. As illustrated in FIG. 2, as the length L of the thick film portion 36 becomes longer, the $K^2_{eff}$ monotonically decreases. A Q-value of resonance characteristics is almost constant regardless of the length L of the thick film portion 36.

Figure 3:
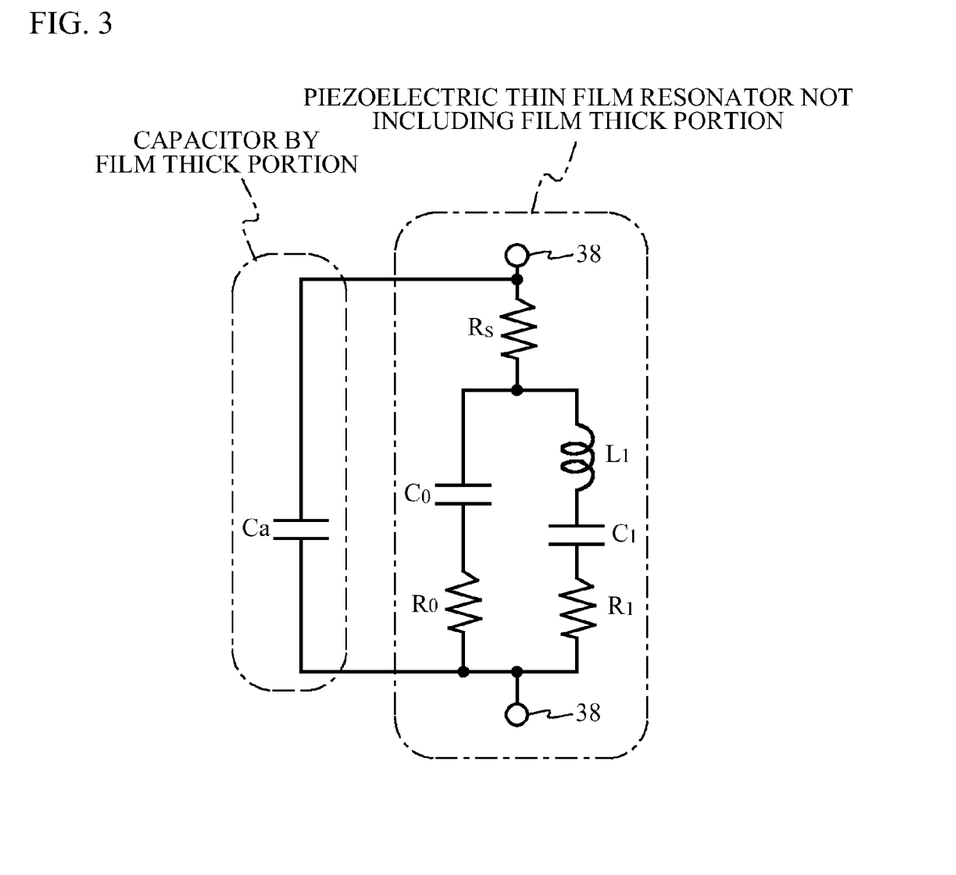
FIG. 3 is an equivalent circuit diagram.

The reason why the $K^2_{eff}$ decreases with increase in the length L of the thick film portion 36 is considered as follows. A resonance vibration is suppressed in the thick film portion 36. An explanation will be given of this effect with an equivalent circuit diagram illustrated in FIG. 3. As illustrated in FIG. 3, an equivalent circuit of a piezoelectric thin film resonator not including the thick film portion 36 is expressed by connecting a resistor Rs, an inductor $L_1$, a capacitor $C_1$ and a resistor $R_1$ in series between terminals 38, and connecting a capacitor $C_0$ and a resistor $R_0$ in parallel to the inductor $L_1$, the capacitor $C_1$ and the resistor $R_1$. When the thick film portion 36 is provided, a capacitor Ca is additionally connected in parallel. The area of the region, in which the resonance vibration is suppressed, increases with increase in the length L of the thick film portion 36, and thus the capacitor Ca increases. When the capacitor Ca increases, the anti-resonance frequency decreases, and thus the $K^2_{eff}$ decreases. Therefore, it is considered that the $K^2_{eff}$ decreases with increase in the length L of the thick film portion 36 as described above.

As described above, found is a new knowledge that the $K^2_{eff}$ can be controlled by changing the length L of the thick film portion 36. Patent Document 1 controls the $K^2_{eff}$ with the thickness of the multilayered film in the resonance region and complicates the fabrication step. On the other hand, the first embodiment controls the $K^2_{eff}$ with the length L of the thick film portion 36, and thus can easily control the $K^2_{eff}$ without increasing the fabrication step. In addition, since the $K^2_{eff}$ monotonically decreases with increase in the length L of the thick film portion 36, the $K^2_{eff}$ can be controlled continuously and precisely. Thus, in the filter having multiple piezoelectric thin film resonators, the $K^2_{eff}$ can be controlled easily and accurately with respect to each of the piezoelectric thin film resonators by adjusting the length L of the thick film portion 36 with respect to each of the piezoelectric thin film resonators.

Figure 4A:
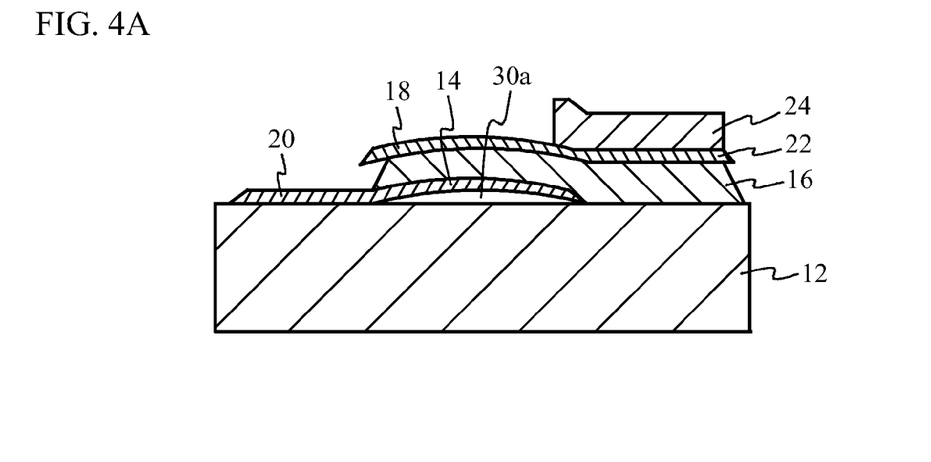
FIG. 4A is a cross-sectional view of a piezoelectric thin film resonator in accordance with a first variation of a first embodiment.
Figure 4B:
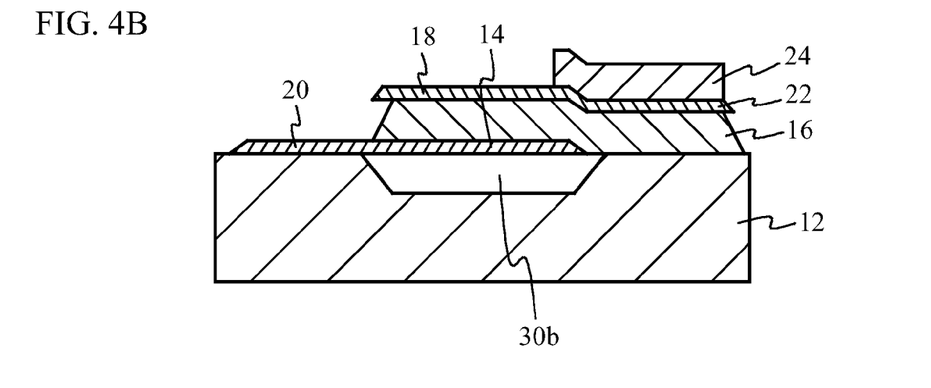
FIG. 4B is a cross-sectional view of a piezoelectric thin film resonator in accordance with a second variation of the first embodiment.

The space 30 may take a structure illustrated in FIG. 4A and FIG. 4B instead of piercing through the substrate 12 as illustrated in FIG. 1B. FIG. 4A is a cross-sectional view of a piezoelectric thin film resonator in accordance with a first variation of the first embodiment, and FIG. 4B is a cross-sectional view of a piezoelectric thin film resonator in accordance with a second variation of the first embodiment. The structure other than the space is the same as that in FIG. 1B in FIG. 4A and FIG. 4B. As illustrated in FIG. 4A, a space 30a may be located between the upper surface of the substrate 12 and the lower electrode 14. As illustrated in FIG. 4B, a space 30b may be located by removing a part of the substrate 12 below the lower electrode 14. The space 30a and the space 30b can be formed by carrying out the fabrication process using a sacrifice layer, and removing the sacrifice layer by wet etching.

Figure 4C:
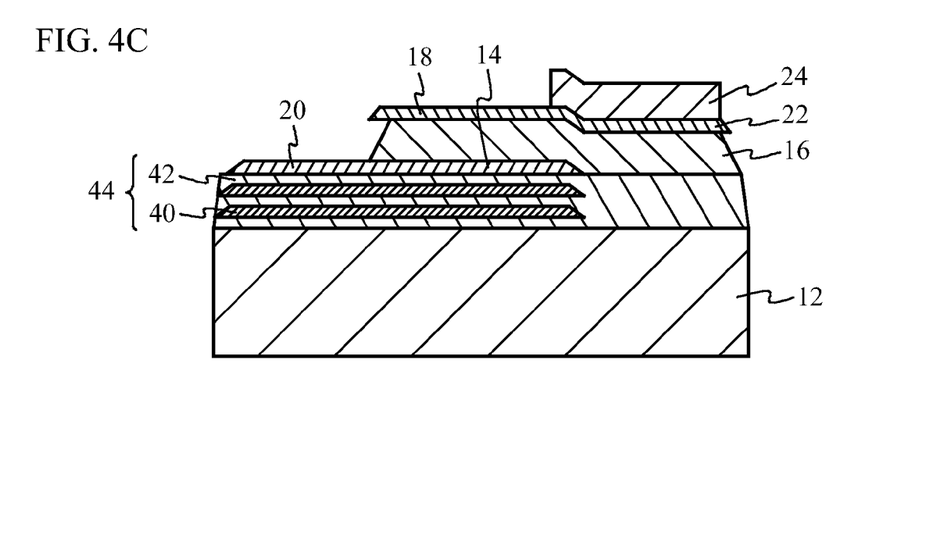
FIG. 4C is a cross-sectional view of a piezoelectric thin film resonator in accordance with a third variation of the first embodiment.

The piezoelectric thin film resonator is not limited to the FBAR type, and may be of the SMR type. FIG. 4C is a cross-sectional view of a piezoelectric thin film resonator in accordance with a third variation of the first embodiment. As illustrated in FIG. 4C, the SMR type piezoelectric thin film resonator has an acoustic reflection film 44 formed by stacking a film 40 having a high acoustic impedance and a film 42 having a low acoustic impedance alternately with a film thickness of λ/4 (λ is a wavelength of an acoustic wave) instead of the space 30. Other structures are the same as those in FIG. 1B.

Figure 5A:
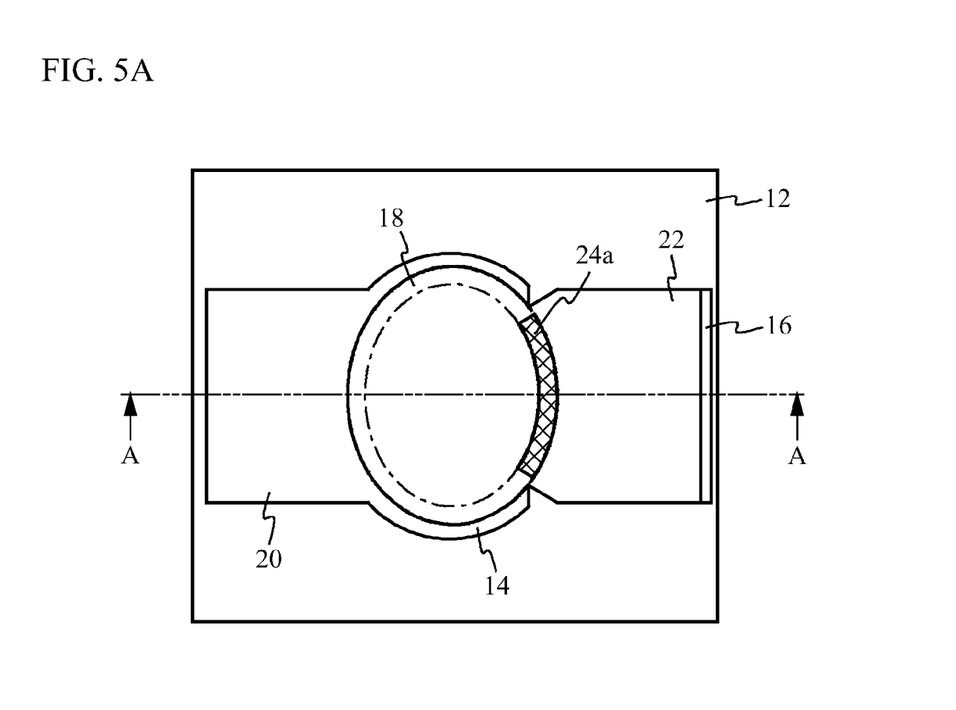
FIG. 5A is a top view of a piezoelectric thin film resonator in accordance with a fourth variation of the first embodiment.
Figure 5B:
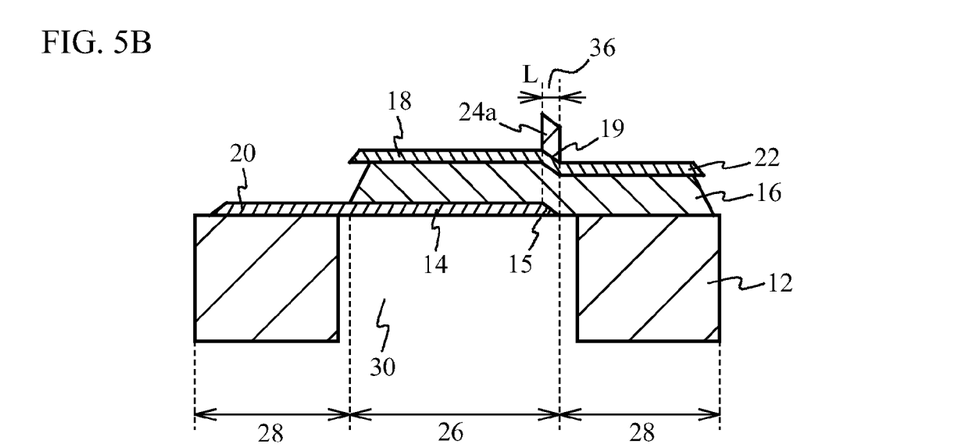
FIG. 5B is a cross-sectional view taken along line A-A in FIG. 5A.
Figure 6A:
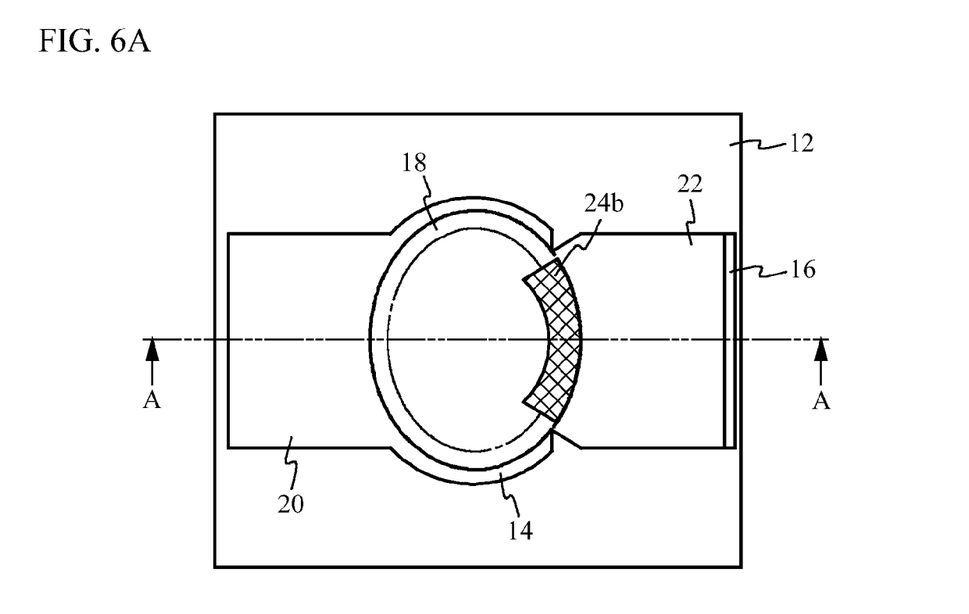
FIG. 6A is a top view of a piezoelectric thin film resonator in accordance with a fifth variation of the first embodiment.
Figure 6B:
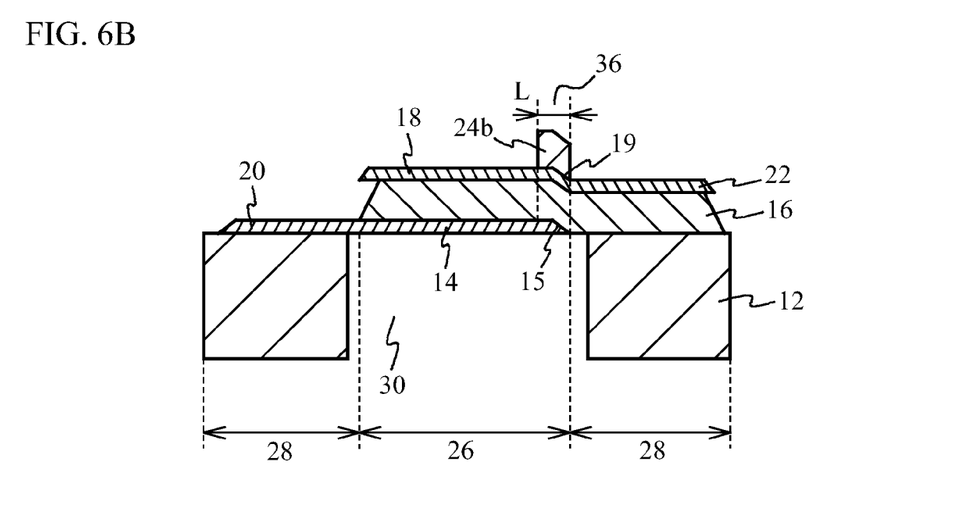
FIG. 6B is a cross-sectional view taken along line A-A in FIG. 6A.

The additional film 24 may not be located on the second terminal electrode 22, but may be located at a position illustrated in FIG. 5A through FIG. 6B for example. FIG. 5A is a top view of a piezoelectric thin film resonator in accordance with a fourth variation of the first embodiment, and FIG. 5B is a cross-sectional view taken along line A-A in FIG. 5A. FIG. 6A is a top view of a piezoelectric thin film resonator in accordance with a fifth variation of the first embodiment, and FIG. 6B is a cross-sectional view taken along line A-A in FIG. 6A. In FIG. 5A through FIG. 6B, the structure other than the additional film is the same as that in FIG. 1A and FIG. 1B. As illustrated in FIG. 5A and FIG. 5B, an additional film 24a may be located in only the incline portion 19 of the upper electrode 18. As illustrated in FIG. 6A and FIG. 6B, an additional film 24b may be located in the incline portion 19 of the upper electrode 18 and a flat portion located further in than the incline portion 19. As described above, it is sufficient if the additional film is located in the outer peripheral portion of the resonance region 26.

In FIG. 1A and FIG. 1B and FIG. 5A through FIG. 6B, the piezoelectric film 16 is located so as to extend only from the resonance region 26 to underneath of the second terminal electrode 22, and the upper electrode 18 protrudes like eaves at the first terminal electrode 20 side. That is to say, as illustrated in FIG. 1A and FIG. 1B, the edge portion of the piezoelectric film 16 is located between the lower electrode 14 and the upper electrode 18, and the upper electrode 18 protrudes like eaves in a range W2. This enables to suppress leakage of acoustic waves from the resonance region 26 to the non-resonance region 28 in the range W2. In such a case, it is possible to suppress leakage of acoustic waves from the resonance region 26 to the non-resonance region 28 in a range W1 by forming the thick film portion 36 in the outer peripheral portion of the resonance region 26 in the range W1. This enables to improve the Q-value of resonance characteristics.

The piezoelectric film 16 may not be provided so that the upper electrode 18 protrudes like eaves, and may be provided so as to extend from the resonance region 26 to a region located further out than the resonance region 26 other than the region underneath the second terminal electrode 22. Moreover, the additional film may not be located in the part of the outer peripheral portion of the resonance region 26, but may be located along an entire circumference of the outer peripheral portion.

Figure 7A:
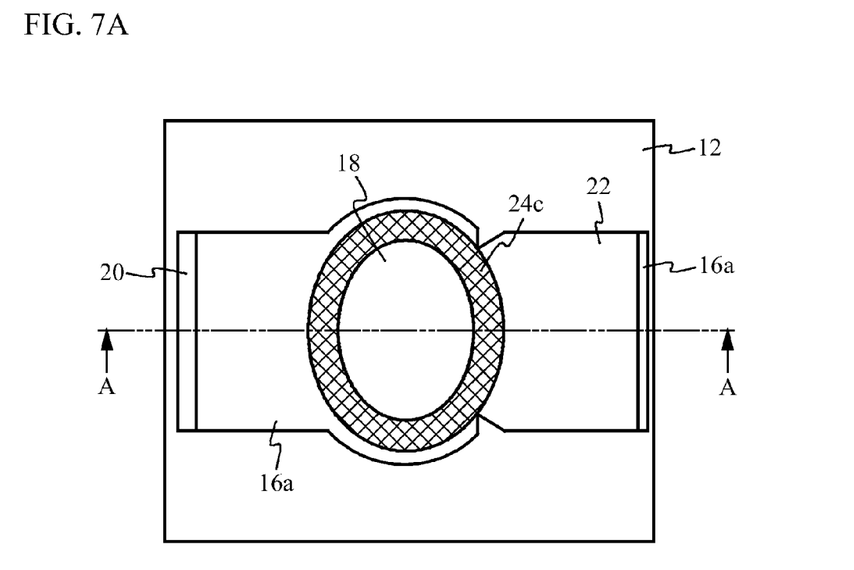
FIG. 7A is a top view of a piezoelectric thin film resonator in accordance with a sixth variation of the first embodiment.
Figure 7B:
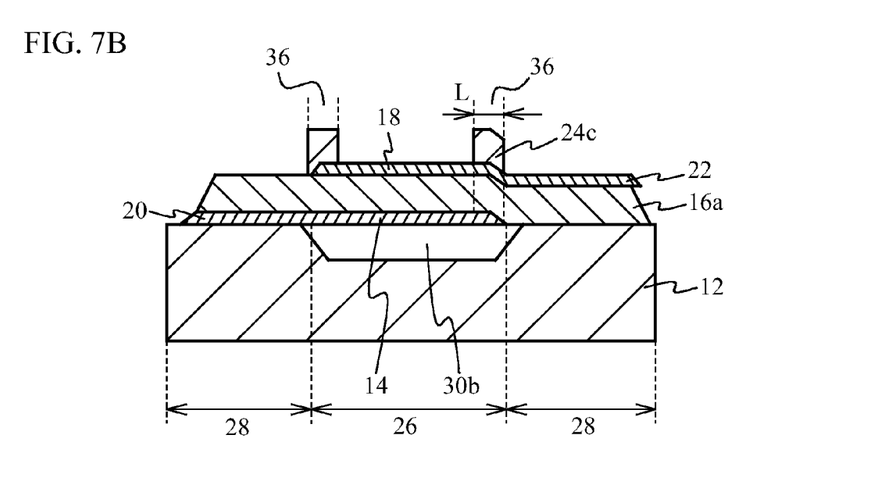
FIG. 7B is a cross-sectional view taken along line A-A in FIG. 7A.

FIG. 7A is a top view of a piezoelectric thin film resonator in accordance with a sixth variation of the first embodiment, and FIG. 7B is a cross-sectional view taken along line A-A in FIG. 7A. As illustrated in FIG. 7A and FIG. 7B, a piezoelectric film 16a extends from the resonance region 26, and is located on the first terminal electrode 20 and underneath the second terminal electrode 22. An additional film 24c is located on the upper electrode 18 along the entire circumference of the outer peripheral portion of the resonance region 26. The space 30b is formed by removing a part of the substrate 12 below the lower electrode 14. Other structures are the same as those of FIG. 1A and FIG. 1B.

The $K^2_{eff}$ can be controlled by changing the length L of the thick film portion 36 even when the thick film portion 36 is formed along the entire circumference of the outer peripheral portion of the resonance region 26 with the additional film 24c. When the piezoelectric film 16a is provided so as to extend from the resonance region 26 to the region located further out than the resonance region 26 along the entire circumference of the resonance region 26, the thick film portion 36 is preferably formed along the entire circumference of the outer peripheral portion of the resonance region 26 in order to suppress the leakage of acoustic waves from the resonance region 26 to the non-resonance region 28 and improve the Q-value of resonance characteristics. As described above, the thick film portion 36 is preferably located in a region in which the piezoelectric film 16 is extracted from the resonance region 26 to the outside of the resonance region 26 in the outer peripheral portion of the resonance region 26. This enables to suppress the leakage of acoustic waves from the resonance region 26 to the non-resonance region 28, and improve the Q-value of resonance characteristics.

Therefore, as illustrated in FIG. 1A and FIG. 1B and FIG. 5A through FIG. 7B, it becomes possible to improve the Q-value of resonance characteristics by providing the thick film portion 36 in at least a part of the outer peripheral portion of the resonance region 26.

The additional film may not be located on the upper electrode 18, but may be located between the upper electrode 18 and the piezoelectric film 16, between the lower electrode 14 and the piezoelectric film 16, or below the lower electrode 14. Instead of providing the additional film, the thick film portion 36 may be formed in the outer peripheral portion of the resonance region 26 by making at least one of the lower electrode 14, the piezoelectric film 16, and the upper electrode 18 thicker in the outer peripheral portion than in the inner portion of the resonance region 26.

Figure 8:
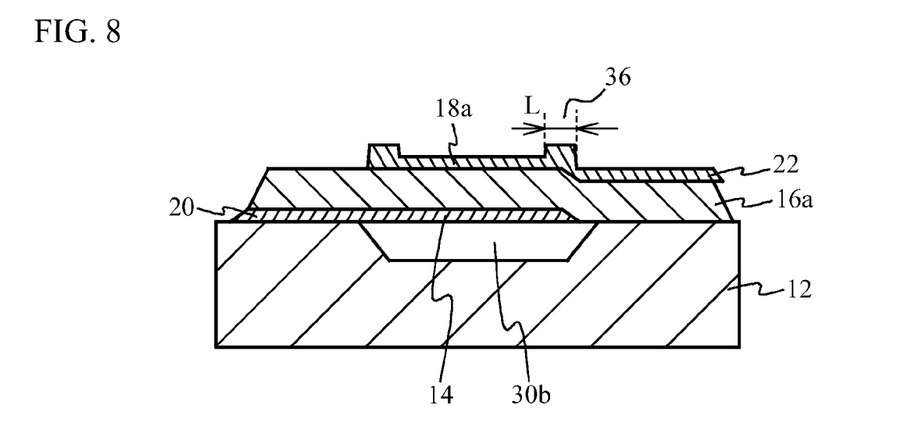
FIG. 8 is a cross-sectional view of a piezoelectric thin film resonator in accordance with a seventh variation of the first embodiment.

Here, a description will be given of an example of forming the thick film portion 36 in the outer peripheral portion of the resonance region 26 by making the upper electrode 18 thick. FIG. 8 is a cross-sectional view of a piezoelectric thin film resonator in accordance with a seventh variation of the first embodiment. As illustrated in FIG. 8, an upper electrode 18a is thicker in the outer peripheral portion than in the inner portion of the resonance region 26. As described above, the $K^2_{eff}$ can be controlled by changing the length L of the thick film portion 36 even when the thick film portion 36 is formed in the outer peripheral portion of the resonance region 26 by making the upper electrode 18a thicker in the outer peripheral portion of the resonance region 26.

As illustrated in FIG. 1A and FIG. 1B, it is preferable that the thick film portion 36 is formed with the additional film 24 located on the upper electrode 18, and the additional film 24 is located so as to extend on the second terminal electrode 22. This enables to use the additional film 24 as a foundation for forming bumps for flip-chip mounting. In this case, the additional film 24 is preferably a multilayered film of Ti and Au.

The piezoelectric thin film resonator of the filter of the first embodiment may be at least one of the piezoelectric thin film resonators described in FIG. 1A, FIG. 1B and FIG. 4A through FIG. 8.

Figure 9:
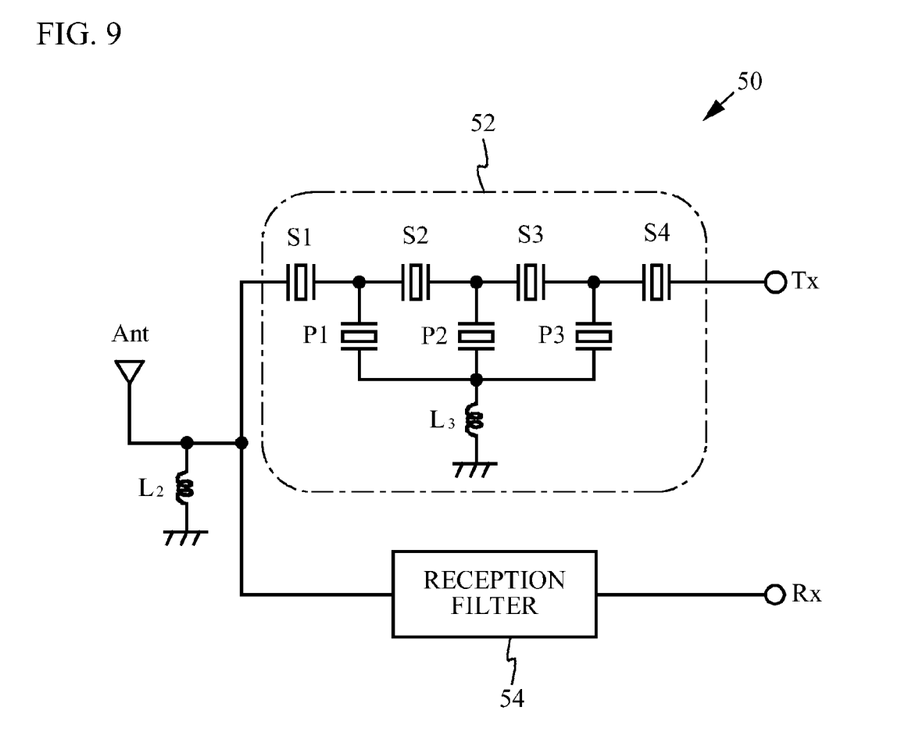
FIG. 9 is a circuit diagram of a duplexer using the filter of the first embodiment to a transmission filter.

FIG. 9 is a circuit diagram of a duplexer using the filter of the first embodiment for a transmission filter. As illustrated in FIG. 9, a transmission filter 52 is connected between an antenna terminal Ant and a transmission terminal Tx, and a reception filter 54 is connected between the antenna terminal Ant and a reception terminal Rx in a duplexer 50. An inductor $L_2$ is connected between the antenna terminal Ant and a ground. The transmission filter 52 passes signals in a transmission band out of signals input from the transmission terminal Tx to the antenna terminal Ant as a transmission signal, and suppresses signals having other frequencies. The reception filter 54 passes signals in a reception band out of signals input from the antenna terminal Ant to the reception terminal Rx as a reception signal, and suppresses signals having other frequencies. The inductor $L_2$ is used for matching, and matches the impedance so that the transmission signal that has passed through the transmission filter 52 is output from the antenna terminal Ant without leaking to the reception filter 54 side.

The duplexer 50 is for Band 25 of W-CDMA (Wideband Code Division Multiple Access) (transmission band: 1850 to 1915 MHz, reception band: 1930 to 1995 MHz), for example. Both of the transmission filter 52 and the reception filter 54 are ladder-type filters in which multiple piezoelectric thin film resonators are used as a series resonator and a parallel resonator and connected in a ladder shape. Hereinafter, a description will be given of the transmission filter 52.

The transmission filter 52 have series resonators S1 through S4 and parallel resonators P1 through P3. Ground-side ends of the parallel resonators P1 through P3 are unified, and an inductor $L_3$ is connected between the parallel resonators P1 through P3 and a ground. The series resonators S1 through S4 and the parallel resonators P1 through P3 are the piezoelectric thin film resonators having the structure illustrated in FIG. 4B.

Figure 10A:
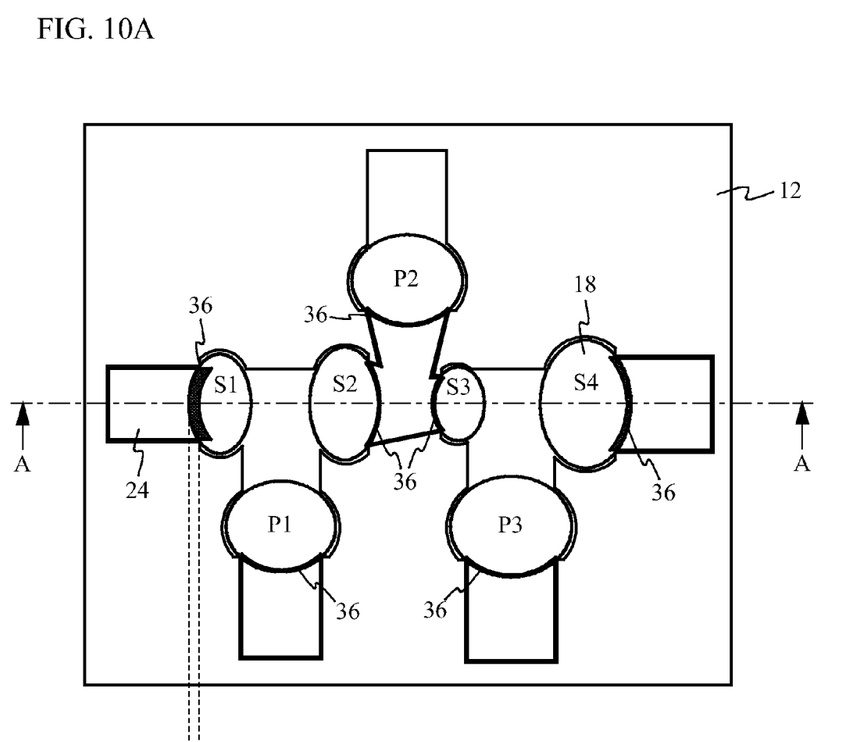
FIG. 10A is a top view of the transmission filter.
Figure 10B:
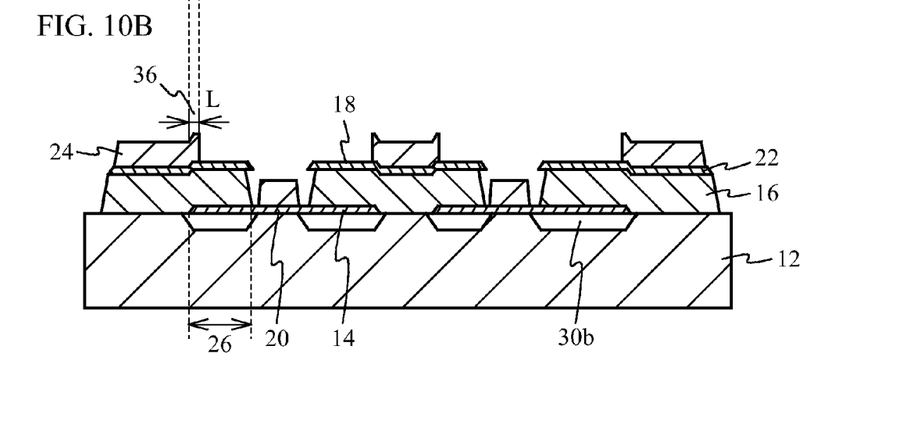
FIG. 10B is a cross-sectional view taken along line A-A in FIG. 10A.

FIG. 10A is a top view of the transmission filter 52, and FIG. 10B is a cross-sectional view taken along line A-A in FIG. 10A. As illustrated in FIG. 10A and FIG. 10B, the series resonators S1 through S4 and the parallel resonators P1 through P3 are formed on the single substrate 12. The substrate 12 is a Si substrate.

The series resonators S1 through S4 include the lower electrode 14 and the first terminal electrode 20 on the substrate 12. The lower electrode 14 is formed by stacking Cr with a film thickness of 100 nm and Ru with a film thickness of 230 nm in this order from the substrate 12 side. The piezoelectric film 16 made of AlN with a film thickness of 1300 nm is located on the lower electrode 14. The upper electrode 18 and the second terminal electrode 22 are located on the piezoelectric film 16. The upper electrode 18 is formed by stacking Ru with a film thickness of 230 nm and Cr with a film thickness of 30 nm in this order from the piezoelectric film 16 side.

The parallel resonators P1 through P3 include the lower electrode 14 and the first terminal electrode 20 on the substrate 12. The lower electrode 14 is formed by stacking Cr with a film thickness of 100 nm and Ru with a film thickness of 230 nm in this order from the substrate 12 side. The piezoelectric film 16 made of AlN with a film thickness of 1300 nm is located on the lower electrode 14. The upper electrode 18 and the second terminal electrode 22 are located on the piezoelectric film 16. The upper electrode 18 is formed by stacking Ru with a film thickness of 230 nm, Ti with a film thickness of 135 nm, and Cr with a film thickness of 30 nm in this order from the piezoelectric film 16 side.

The space 30b formed by removing a part of the substrate 12 is located below the resonance region 26 in which the lower electrode 14 and the upper electrode 18 face each other across the piezoelectric film 16 in the series resonators S1 through S4 and the parallel resonators P1 through P3. The additional film 24 is located on the second terminal electrode 22 so as to extend to the outer peripheral portion of the resonance region 26. The additional film 24 is formed by stacking Ti with a film thickness of 100 nm and Au with a film thickness of 500 nm in this order from the second terminal electrode 22 side. The thick film portion 36 is formed in the part of the outer peripheral portion of the resonance region 26 by providing the above described additional film 24. In addition, an oxide silicon film (not illustrated) with a film thickness of 50 nm is located in a part other than the additional film 24. Table 1 presents the length L of the thick film portion 36 in the series resonators S1 through S4 and the parallel resonators P1 through P3.

TABLE 1

| RESONATOR | LENGTH L OF THICK FILM PART |
|---|---|
| S1 | 24 μm |
| S2 | 3 μm |
| S3 | 3 μm |
| S4 | 10 μm |
| P1 | 3 μm |
| P2 | 3 μm |
| P3 | 3 μm |

Figure 11:
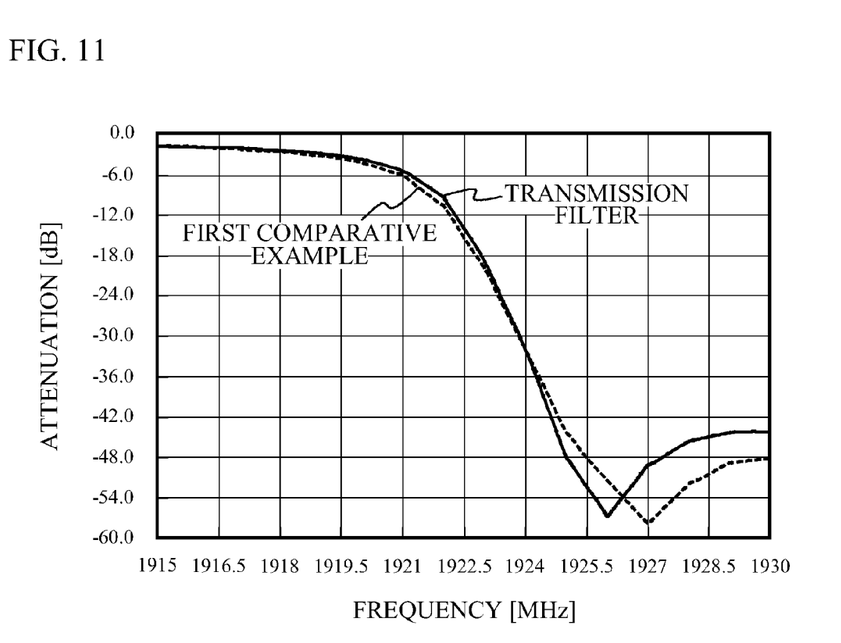
FIG. 11 is a diagram illustrating pass characteristics at a high frequency side of a passband of the transmission filter.

Here, a description will be given of a pass characteristic of the transmission filter 52. FIG. 11 is a diagram illustrating the pass characteristic at a high frequency side of a passband of the transmission filter 52. FIG. 11 also illustrates a pass characteristic of a filter in accordance with a first comparative example for comparison. The additional film 24 does not extend to the resonance region 26, and the edge portion of the additional film 24 is located 5 μm away from the edge of the resonance region 26 to the second terminal electrode 22 side in the filter of the first comparative example. Other structures are the same as those of the transmission filter 52. As illustrated in FIG. 11, a transition width between −1.5 dB and −48 dB is 11.0 MHz in the transmission filter 52, and is 12.3 MHz in the first comparative example. As described above, the transmission filter 52 improves the skirt characteristic by 1.3 MHz compared to the first comparative example.

In a ladder-type filter, a series resonator contributes to a skirt characteristic at a high frequency side of a passband, and a parallel resonator contributes to a skirt characteristic at a low frequency side. That is to say, the reduction of the $K^2_{eff}$ of the series resonator achieves the steep skirt characteristic at the high frequency side, and the reduction of the $K^2_{eff}$ of the parallel resonator achieves the steep skirt characteristic at the low frequency side. The length L of the thick film portion 36 of the series resonator is made to be long, and the $K^2_{eff}$ of the series resonator is made to be small in the transmission filter 52 as presented in Table 1. This enables to achieve the steep skirt characteristic at the high frequency side of the passband as illustrated in FIG. 11.

As presented in Table 1, at least two of the piezoelectric thin film resonators (the series resonators S1 through S4 and the parallel resonators P1 through P3) have the length L of the thick film portion 36 different from each other in the transmission filter 52. This enables to control the $K^2_{eff}$ easily and accurately with respect to each piezoelectric thin film resonator as described in FIG. 2. As described above, the $K^2_{eff}$ can be controlled with respect to each piezoelectric thin film resonator, and the steep skirt characteristic of the filter can be achieved by making the $K^2_{eff}$ of each piezoelectric thin film resonator proper as described in FIG. 11.

As described above, in the ladder-type filter, it is possible to achieve the steep skirt characteristic at the high frequency side of the passband by making the length L of the thick film portion 36 of the series resonator long, and to achieve the steep skirt characteristic at the low frequency side by making the length L of the thick film portion 36 of the parallel resonator long. That is to say, the length L of the thick film portion 36 of the series resonator and/or the length L of the thick film portion 36 of the parallel resonator is made to be long to achieve the steep skirt characteristic at the high frequency side and/or the low frequency side of the passband. Thus the length L of the thick film portion 36 of the series resonator becomes different from that of the parallel resonator. The length L of the thick film portion 36 may be an average value or a maximum value of the length L of the thick film portion 36, for example.

Especially, it is preferable to control the $K^2_{eff}$ with respect to each of the series resonators by making the series resonators have the length L of the thick film portion 36 different from each other in order to further improve the skirt characteristic at the high frequency side of the passband. It is preferable to control the $K^2_{eff}$ with respect to each of the parallel resonators by making the parallel resonators have the length L of the thick film portion 36 different from each other in order to further improve the skirt characteristic at the low frequency side. Therefore, it is possible to achieve the steep skirt characteristic at the high frequency side and/or the low frequency side of the passband by making the series resonators have the length of the thick film portion 36 different from each other, and/or making the parallel resonators have the length of the thick film portion 36 different from each other. Moreover, it is possible to widen the bandwidth of the passband by making the series resonators have the length L of the thick film portion 36 different from each other and making the parallel resonators have the length L of the thick film portion 36 different from each other.

The $K^2_{eff}$ of the series resonator and the parallel resonator may be controlled by making the series resonators have the length L of the thick film portion 36 equal to each other, making the parallel resonators have the length of the thick film portion 36 equal to each other, and adjusting the lengths L of the respective thick film portions 36 of the series resonators and the lengths L of the respective thick film portions 36 of the parallel resonators. Even in this case, it is possible to improve the skirt characteristic at the high frequency side and/or the low frequency side of the passband.

Although the steep skirt characteristic can be achieved at both of the high frequency side and the low frequency side by reducing the $K^2_{eff}$ of the series resonator and the parallel resonator, this makes the passband narrow. That is to say, the steep skirt characteristic is in a tradeoff relation with bandwidth widening of the passband. This is convenient when the passband is a narrow band. However, Band 25 (transmission band: 1850 to 1915 MHz, reception band: 1930 to 1995 MHz) and Band 3 (transmission band: 1710 to 1785 MHz, reception band: 1805 to 1880 MHz) of W-CDMA have a relatively wide transmission band and reception band. Thus, it is difficult to secure the transmission band and the reception band if both of the $K^2_{eff}$ of the series resonator and the parallel resonator are reduced.

The steep skirt characteristic at the guard band side is desired in the transmission filter and the reception filter composing the duplexer. Therefore, it is preferable to form the series resonator or the parallel resonator contributing to the skirt characteristic at the guard band side, which is desired to be steep, with a resonator having a relatively small $K^2_{eff}$, and to form the series resonator or the parallel resonator contributing to the skirt characteristic at an opposite side to the guard band with a resonator having a relatively large $K^2_{eff}$ in order to widen the bandwidth of the passband. Thus, in the transmission filter 52, the length L of the thick film portion 36 of the series resonator is made to be large and the $K^2_{eff}$ of the series resonator is made to be relatively small in order to achieve the steep skirt characteristic at the high frequency side, i.e. the guard band side. On the other hand, the length L of the thick film portion 36 of the parallel resonator is not made to be so long, and the $K^2_{eff}$ of the parallel resonator is made to be relatively large in order to widen the bandwidth of the passband.

In FIG. 9 through FIG. 11, the filter of the first embodiment is used for the transmission filter 52, but may be used for at least one of the transmission filter 52 and the reception filter 54. It is desired to make the skirt characteristic at the low frequency side, i.e. the guard band side, steep in the reception filter 54. Therefore, when the filter of the first embodiment is used for the reception filter 54, it is preferable to achieve the steep skirt characteristic at the low frequency side by making the length L of the thick film portion 36 of the parallel resonator long, and to widen the bandwidth of the passband by making the length L of the thick film portion 36 of the series resonator not so long.

As described above, in the duplexer, it is preferable to make the length L of the thick film portion 36 of a resonator, which is the series resonator or the parallel resonator so as to contribute to the skirt characteristic at the guard band side, longer than that of the other one. This enables to widen the bandwidth of the passband and achieve the steep skirt characteristic at the guard band side. The length L of the thick film portion 36 may be an average value or a maximum value of the length L of the thick film portion 36.

It is more preferable to make resonators, which are the series resonators or the parallel resonators so as to contribute to the skirt characteristic at the guard band side, have the length L of the thick film portion 36 different from each other. This enables to widen the bandwidth of the passband, and achieve the further steep skirt characteristic at the guard band side.

The lower electrode, the first terminal electrode, the upper electrode, and the second terminal electrode may be a metal film including aluminum (Al), copper (Cu), molybdenum (Mo), tungsten (W), tantalum (Ta), platinum (Pt), ruthenium (Ru), rhodium (Rh), and iridium (Ir), or a multilayered film of those. The additional film may be a single layer film or multilayered film made of materials other than Ti and Au beside the multilayered film of Ti and Au.

The piezoelectric film having a high Q-value can be formed stably by using AlN for example. The piezoelectric constant of the piezoelectric film may be increased by adding an element such as scandium (Sc) to AlN in order to make the $K^2_{eff}$ large. This enables to widen the bandwidth of the passband. In this case, it is desirable that the piezoelectric film includes AlN as a main component. Here, AlN may include an element to extent that AlN functions as the piezoelectric film of the piezoelectric thin film resonator, and for example, x is smaller than 0.5 in $M_X Al_{1-X} N$ in which an element M is added to AlN.

The piezoelectric film may be made of a piezoelectric material such as zinc oxide (ZnO), lead zirconate titanate (PZT), or lead titanate ($PbTiO_3$).

Edge portions of the lower electrode, the piezoelectric film, and the upper electrode are inclined in the first embodiment, but may be vertically located instead of being inclined. The filter of the first embodiment may be used in devices other than the duplexer.

Although the ladder-type filter of the first embodiment includes the series resonators and the parallel resonators, the ladder-type filter may include a plurality of series resonators and/or a plurality of parallel resonators. Furthermore, the filter of the first embodiment may be a filter including multiple piezoelectric thin film resonators such as a lattice-type filter beside the ladder-type filter. The duplexer may be for other than Band 25 of W-CDMA.

Although the embodiments of the present invention have been described in detail, it is to be understood that the various change, substitutions, and alterations could be made hereto without departing from the spirit and scope of the invention.

What is claimed is:

1. A filter comprising:
   a plurality of piezoelectric thin film resonators, each having a multilayered film including a lower electrode located on a substrate, a piezoelectric film located on the lower electrode, and an upper electrode located on the piezoelectric film so as to face the lower electrode, wherein
   at least two piezoelectric thin film resonators each have a thick film portion in at least a part of an outer peripheral portion of a resonance region, the thick film portion being absent in an inner area of the resonance region that is surrounded by said outer peripheral portion, and the multilayered film in the thick film portion is thicker than the multilayered film in any other areas in the resonance region, the resonance region being defined as a region where the lower electrode and the upper electrode face each other across the piezoelectric film for each of said at least two piezoelectric thin film resonators, and
   respective lengths of the thick film portions from edges of the resonance regions are different from each other in the at least two piezoelectric thin film resonators.

2. The filter according to claim 1, wherein
   the plurality of piezoelectric thin film resonators include a series resonator that is connected in series between terminals and a parallel resonator that is connected in parallel between the terminals, the series resonator and the parallel resonator forming a ladder-type filter.

3. The filter according to claim 2, wherein
   the length of the thick film portion from the edge of the resonance region of the series resonator is different from that of the parallel resonator.

4. The filter according to claim 3, wherein
   the filter includes a plurality of the series resonators and/or a plurality of the parallel resonators, and
   the lengths of the thick film portions from the edges of the resonance regions are different from each other in the plurality of the series resonators and/or the lengths of the thick film portions from the edges of the resonance regions are different from each other in the plurality of the parallel resonators.

5. The filter according to claim 1, wherein
   the piezoelectric film is mainly made of aluminum nitride.

6. The filter according to claim 1, wherein
   the piezoelectric film includes an element that increases a piezoelectric constant.

7. The filter according to claim 1, wherein
a space is located below the lower electrode.

8. The filter according to claim 1, wherein
an acoustic reflection film is located below the lower electrode.

9. A duplexer comprising;
the filter according to claim 1 as at least one of a transmission filter and a reception filter.

10. A duplexer comprising:
the filter according to claim 1 as at least one of a transmission filter and a reception filter, wherein
at least one of the transmission filter and the reception filter is a ladder-type filter in which a series resonator and a parallel resonator included in the piezoelectric thin film resonators are connected in a ladder shape,
the length of the thick film portion from the edge of the resonance region of one resonator, which is the series resonator or the parallel resonator so as to contribute to a skirt characteristic at a side of a guard band between a transmission band and a reception band, is longer than that of the other resonator.

11. The duplexer according to claim 10, wherein
the duplexer includes a plurality of the series resonators and/or a plurality of the parallel resonators, and the lengths of the thick film portions from the edges of the resonance regions are different from each other in resonators that are the plurality of the series resonators or the plurality of the parallel resonators so as to contribute to the skirt characteristic at the side of the guard band.

12. The filter according to claim 1, wherein
a space is located below the lower electrode in the resonance region,
the thick film portion is located over the space.

13. The filter according to claim 1, wherein
an acoustic reflection film is located below the lower electrode in the resonance region,
the thick film portion is located over the acoustic reflection film.

14. The filter according to claim 1, further comprising an additional film that forms the thick film portion, wherein
the upper electrode has an incline portion that is located above an edge of the lower electrode, and
at least a portion of the additional film is located in the incline portion of the upper electrode.

15. The filter according to claim 1, further comprising an additional film that forms the thick film portion, wherein
the additional film is provided continuously from an inside to an outside of the resonance region.

* * * * *